United States Patent
Fry

[11] Patent Number: 6,133,674
[45] Date of Patent: Oct. 17, 2000

[54] LOW PROFILE INTEGRATED OSCILLATOR HAVING A STEPPED CAVITY

[75] Inventor: Steven J. Fry, Carlisle, Pa.

[73] Assignee: CTS, Elkhart, Ind.

[21] Appl. No.: 09/179,515

[22] Filed: Oct. 27, 1998

[51] Int. Cl.[7] .................................................. H01L 41/04
[52] U.S. Cl. .......................................... 310/343; 310/341
[58] Field of Search ................................... 310/341, 343, 310/344

[56] References Cited

U.S. PATENT DOCUMENTS

| | | | |
|---|---|---|---|
| 3,715,563 | 2/1973 | Bloch ...................................... | 219/210 |
| 3,931,388 | 1/1976 | Hafner et al. . | |
| 3,962,559 | 6/1976 | Drda et al. ............................... | 219/210 |
| 4,157,466 | 6/1979 | Herrin ..................................... | 219/210 |
| 4,266,157 | 5/1981 | Peters . | |
| 4,334,168 | 6/1982 | Besson et al. ........................... | 310/343 |
| 4,453,104 | 6/1984 | Rapps et al. . | |
| 4,471,259 | 9/1984 | Stoermer et al. . | |
| 4,524,497 | 6/1985 | Rapps et al. . | |
| 4,748,367 | 5/1988 | Bloch et al. ............................ | 310/343 |
| 4,750,246 | 6/1988 | Pollard . | |
| 4,985,655 | 1/1991 | Jensik et al. . | |
| 5,041,800 | 8/1991 | Long et al. . | |
| 5,250,870 | 10/1993 | Fenlon et al. . | |
| 5,382,929 | 1/1995 | Inao et al. . | |
| 5,430,345 | 7/1995 | Takahashi . | |
| 5,438,219 | 8/1995 | Kotzan et al. .......................... | 257/469 |
| 5,500,628 | 3/1996 | Knecht ................................... | 310/348 |
| 5,568,006 | 10/1996 | Luff et al. . | |
| 5,640,746 | 6/1997 | Knecht et al. . | |
| 5,696,422 | 12/1997 | Hanson et al. . | |
| 5,917,272 | 6/1999 | Clark et al. ............................. | 310/343 |

*Primary Examiner*—Nestor Ramirez
*Assistant Examiner*—Peter Medley
*Attorney, Agent, or Firm*—Mark P. Bourgeois; Mark Borgman

[57] ABSTRACT

A low profile integrated oscillator operable to provide an oscillator signal includes a thermally conductive substrate having a cavity and a ledge. A crystal or other resonator is located in the cavity and mounted to the ledge. The resonator stabilizes the oscillator signal. An electrical circuit is mounted to the substrate and electrically connects to the resonator to condition the oscillator signal. A cover seals the resonator in the cavity. A via electrically connects the resonator to the electrical circuit. A heater is mounted to the substrate, outside the cavity, for elevating the temperature inside the cavity and a temperature sensor is mounted to the substrate to monitor the oscillator temperature. The substrate is surrounded by an insulation and mounted within a housing. The housing has a connector for connecting to an external electrical circuit.

8 Claims, 2 Drawing Sheets

LOW PROFILE INTEGRATED OSCILLATOR HAVING A STEPPED CAVITY

BACKGROUND OF THE PREFERRED EMBODIMENT(S)

1. Field of the Preferred Embodiment(s)

This invention generally relates to oscillators which provide a stable reference source or frequency in computers or other electronic equipment. Specifically, there is a low profile integrated oscillator assembly that is capable of mounting in electronic systems of constrained space requirements. The assembly is also thermally enhanced to improve thermal conduction.

2. Description of the Related Art

Various devices are well known for providing a reference frequency or source such devices are called oscillators. The oscillator typically has a quartz crystal source and also has electronic compensation circuitry to stabilize the output frequency. Ovenized oscillators heat the oscillator to a uniform temperature to obtain a more stable output. The oscillators have been packaged on various support structures and in housings such as metal cans. Current low profile ovenized crystal oscillators typically have a height of about one-half inch. The height is typically limited by the size of the holder or can which must be used to enclose the quartz crystal. The size requirements for electronic components are decreasing and at the same time circuit densities are required to increase, especially for portable electronics.

Despite the advantages of the prior art oscillators, none have allowed the user to both stably control the frequency and temperature response and be mounted in low profile applications.

Additionally, the prior art devices have been difficult to incorporate into low profile applications such as notebook computers.

DESCRIPTION OF RELATED ART

Examples of patents related to the present invention are as follows, wherein each patent is herein incorporated by reference for related and supporting teachings:

U.S. Pat. No. 4,985,655, is a crystal header package.

U.S. Pat. No. 4,750,246, is a method of making compensated crystal oscillator.

U.S. Pat. No. 5,696,422, is a crystal package.

U.S. Pat. No. 4,266,157, is a piezoelectric resonator assembly with thin molybdenum mounting clips.

U.S. Pat. No. 3,931,388, is a crystal resonator housing configuration.

U.S. Pat. No. 4,453,104, is a low profile crystal package with an improved crystal mounting arrangement.

U.S. Pat. No. 4,471,259, is a crystal package for a high G environment.

U.S. Pat. No. 4,524,497, is a method of making a low profile crystal package with an improved crystal mounting method.

U.S. Pat. No. 5,041,800, is a lower power oscillator with heated resonators with dual mode or other temperature sensing possibly with an insulative support structure disposed between the resonator and a resonator enclosure.

U.S. Pat. No. 5,250,870, is an ultra thin surface mount crystal package.

U.S. Pat. No. 5,382,929, is a monolithic crystal filter.

U.S. Pat. No. 5,568,006, is a surface mount crystal package with receptacle mounting.

U.S. Pat. No. 5,430,345, is a piezoelectric device.

U.S. Pat. No. 5,640,746, is a method of hermetically encapsulating a crystal oscillator using a thermoplastic shell.

The foregoing patents reflect the state of the art of which the applicant is aware and are tendered with the view toward discharging applicants' acknowledged duty of candor in disclosing information that may be pertinent in the examination of this application. It is respectfully stipulated, however, that none of these patents teach or render obvious, singly or when considered in combination, applicants' claimed invention.

SUMMARY OF THE PREFERRED EMBODIMENT(S)

It is a feature of the invention to provide a low profile integrated oscillator assembly for generating an oscillator signal that provides a stable frequency over a temperature range.

A further feature of the invention is to provide a low profile integrated oscillator operable to provide an oscillator signal which includes a substrate such as aluminum nitride having a cavity and one or more ledges in the cavity. A crystal or other resonator is disposed in the cavity and, supported by the ledge. The resonator can stabilize the oscillator signal. An electrical circuit means is mounted to the substrate and electrically connected to the resonator to condition the oscillator signal. A cover seals the resonator in the cavity.

A connector electrically connects the resonator to the electrical circuit means. The connector passes through an aperture in the substrate and is held in the substrate by solder in the aperture. The connector is fastened to the resonator by a conductive epoxy. A heater is mounted to the substrate to elevate the oscillator temperature and a temperature sensor is mounted to the substrate to monitor and control the oscillator temperature. The substrate is surrounded by a thermal insulation and mounted within a housing. The housing has a connection means for connecting to an external electrical circuit.

A further feature of the invention is to provide a low cost, easily assembled oscillator assembly.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

These and other features of the invention can best be understood by the following description of the accompanying drawings as follows.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the accompanying drawings.

DETAILED DESCRIPTION OF THE PREFERRED EMBODIMENT

Figure 1:
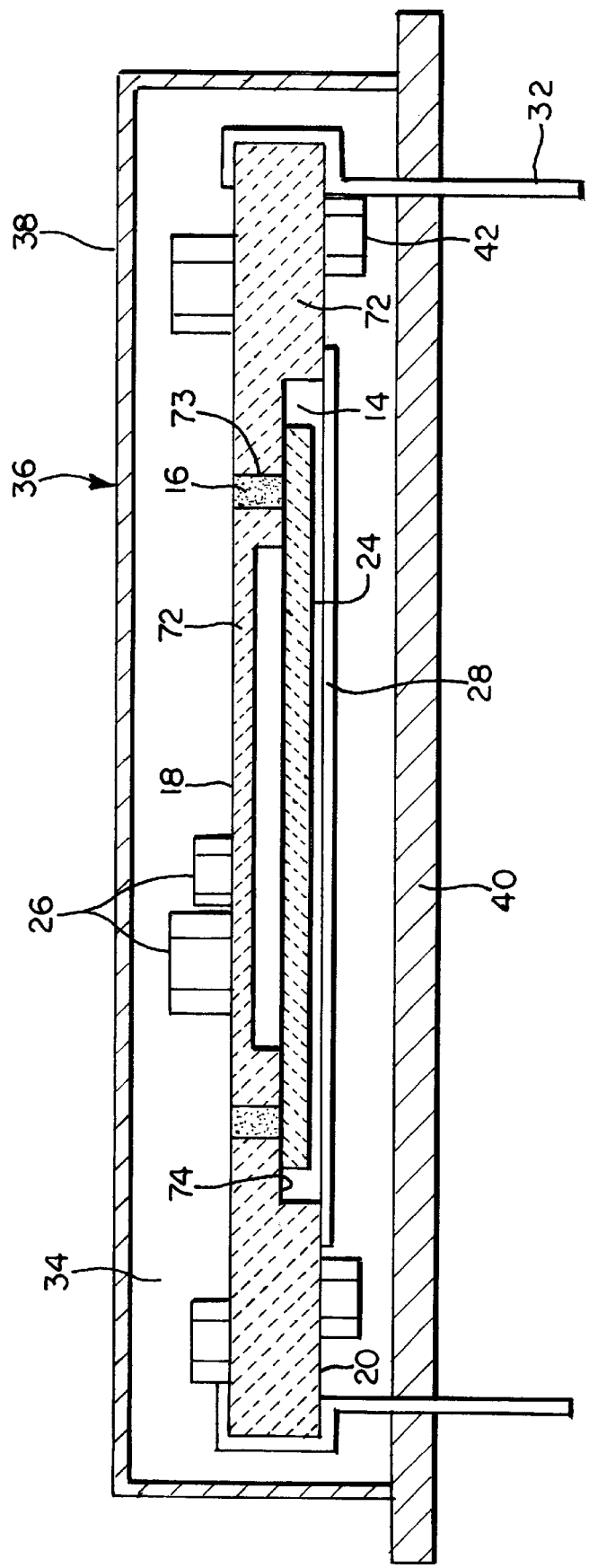
FIG. 1 is a side cross sectional view of a low profile integrated oscillator.
Figure 3:
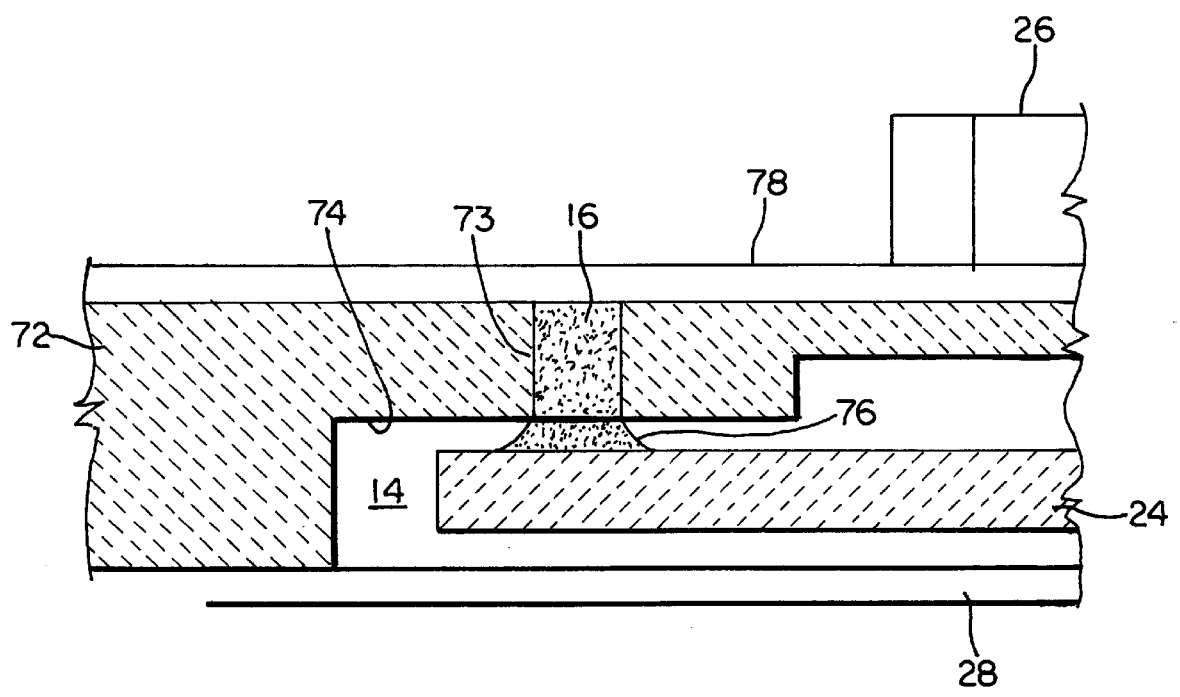
FIG. 3 is an enlarged cross-sectional view of FIG. 1 showing details of the via connections.

Referring to FIGS. 1 and 3, a side cross sectional view of a low profile integrated oscillator is shown. Low profile integrated oscillator assembly 10 includes a planar substrate 72 having a recessed cavity 14. Substrate 72 is a single piece of thermally conductive ceramic such as aluminum nitride. Aluminum nitride is an excellent conductor of heat and allows the heat generated by heater transistors 42 to be readily transferred into cavity 14. The aluminum nitride acts as a thermal enhancer to provide a very uniform temperature profile across the entire assembly 10. This reduces the variations in the oscillator frequency as it operates.

Resonator or crystal 24 is mounted in cavity 14 and stabilizes the oscillator signal. The resonator 24 is mounted to and supported on ledges 74 in cavity 14. The resonator is generally a circular crystal of quartz. Conventional oscillator electrical circuitry 26 is mounted to on top surface 18 of substrate 72 and is electrically connected to by conventional circuit lines 78 to vias 16. Via 16 electrically connects resonator 24 to the circuit lines 78. A conductive epoxy 76 is used to electrically connect resonator 24 to via 16. The via 16 is located in apertures 73 in substrate 72. The circuit lines 78 and vias 16 are conventional thick film conductors typically applied by screen printing and firing. The vias 16 form part of a hermetic seal. Electrical circuit 26 conditions the oscillator signal. A metal cover 28 hermetically seals crystal 24 in cavity 14. Cover 28 can be fastened to substrate 72 by an adhesive or can be soldered or welded.

Pins 32 electrically connect the circuitry 26 to other external electrical circuits (not shown). Substrate 72 in an ovenized application is surrounded by insulation 34 and mounted within a housing 36. Housing 36 has a top can 38 and a bottom piece 40 such as a printed circuit board. Pins 32 pass through bottom piece 40. It is understood that assembly 10 can be used without housing 36 and insulation 34, if an ovenized oscillator is not required. Substrate 72 can be directly mounted to another printed circuit board.

Figure 2:
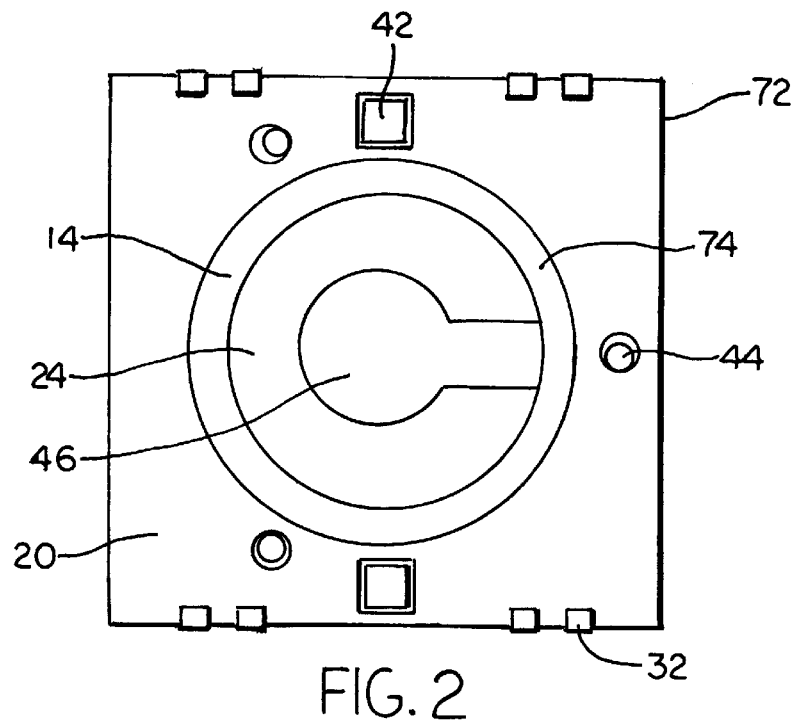
FIG. 2 is a bottom view of the substrate of FIG. 1 with the cover removed.

FIG. 2 shows one possible bottom view of substrate 72 of FIG. 1 with cover 28 removed. A pair of heater transistors 42 are mounted to bottom surface 20 to control the oscillator temperature and a temperature sensor 44 is also mounted to surface 20 to monitor the oscillator temperature. Sensor 44 provides feedback to electrical circuitry 26 which also functions to control heater transistors 42. Circuit lines 78 connect transistors 42, sensor 44 and circuitry 26. Crystal 24 has a rounded shape. Crystal 24 has an electrode 46 which is connected to via 16. A potential difference is applied across crystal 24 causing it to resonate.

Oscillator assembly 10 can be assembled as follows: The first step is to metallize the circuit lines 78 onto substrate 72. Next, the vias 16 are screened and fired into apertures 73. A conductive epoxy 76 is placed on ledge 74 over vias 16 and resonator 24 is placed on the conductive epoxy 76 and cured. The assembly would then be placed in a deposition chamber to adjust the oscillating frequency. Next, the cover 28 is placed over cavity 14 in a evacuated atmosphere and sealed using an adhesive, solder or welding process. The electrical circuitry 26, heater transistors 42 and sensors 44 are placed and soldered to substrate 72. Pins 32 are soldered to substrate 72 and placed through a bottom piece 40. Insulation 34 is applied over substrate 72 and top can 38 is placed over insulation 34 and attached to bottom piece 40 by soldering or crimping. The oscillator assembly 10 is then tested.

VARIATIONS OF THE PREFERRED EMBODIMENT(S)

One of ordinary skill in the arts of oscillator and crystal design, will realize many advantages from using the preferred embodiment. Further, one of ordinary skill in the art of making oscillators will realize that there are many different ways of accomplishing the preferred embodiment. For example, it is contemplated to eliminate housing 36 and insulation 34 and mount substrate 72 directly to a printed circuit board. Although electrical circuitry 26 is illustrated above top surface 18, it could be placed on bottom surface 20 or even placed inside cavity 14.

The embodiment shows the use of vias 16 to make an electrical connection between crystal 24 and electrical circuitry 26. Other electrical connections could be used such as edge connectors or a connector extending through aperture 73.

Even though, the embodiment discusses heaters 42 and sensors 44 mounted on surface 20, it is contemplated to mount them on surface 18 or in cavity 14. Further, it is contemplated to omit heaters 42 and sensors 44.

Even though the embodiment discusses the use of aluminum nitride for the substrate 72, one skilled in the art would realize that other thermally conductive ceramics could be used such as silicon carbide or boron nitride.

Although, oscillator 10 is illustrated in as having pins 32 connecting to electrical circuitry 26, it is contemplated to have a surface mount design in which the pins 32 would not pass completely through the bottom piece 40 and edge castellations would be included to facilitate surface mounting to another printed circuit board.

Further, the resonator 24 could be an inverted mesa type crystal or a surface acoustical wave device or a rectangular strip type crystal or other materials.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed and desired to be secured by Letters Patent is:

1. A low profile thermally enhanced oscillator assembly operable to be mounted in a low height enclosure and operable to provide an oscillator signal that is stable over a frequency range and a temperature range, comprising:

a) a thermally conductive substrate having a cavity;

b) a resonator, disposed in the cavity;

c) hermetic sealing means, attached to the substrate, for sealing the resonator inside the cavity; and d) heater means, located outside of the cavity for regulating the temperature of the resonator inside the cavity.

2. The oscillator assembly according to claim 1, wherein a via electrically connects to the resonator.

3. A low profile thermally enhanced oscillator assembly operable to be mounted in a low height enclosure and operable to provide an oscillator signal that is stable over a frequency range and a temperature range, said oscillator mounted within an insulated housing, the improvement comprising: a generally planar substrate having a cavity and a ledge therein; a resonator, disposed substantially within said cavity and supported by said ledge, said resonator operable to stabilize said oscillator signal; a via electrically connecting said resonator to an electrical circuit means, said electrical circuit means mounted to said substrate and operable to condition said oscillator signal in order to provide a stable oscillator signal; a hermetic sealing means for sealing said resonator inside said cavity; and heater means, disposed outside of said cavity for regulating the temperature of said resonator inside said cavity.

4. The oscillator assembly according to claim 3, wherein said substrate is chosen from the group consisting of:
   a) a thermally conductive ceramic;
   b) aluminum nitride; or
   c) boron nitride.

5. An ovenized oscillator operable to provide an oscillator signal, comprising:
   a) a planar substrate having a first surface, an opposed second surface and a cavity located in the second surface, the second surface surrounding the cavity;
   b) an annular ledge, located in the cavity and extending into the cavity;
   c) a plurality of electrically conductive vias passing through the annular ledge between the annular ledge and the first surface;
   d) a resonator, disposed in the cavity and supported by the annular ledge for stabilizing the oscillator signal, the resonator electrically connected to the vias;
   e) a cover sealing the resonator in the cavity; and
   f) a conditioning circuit, located on the first surface and electrically connected to the via, for conditioning the oscillator signal, wherein a transistor heater is located on the second surface, adjacent the cavity and thermally communicated with the cavity through the substrate for heating the resonator, the heater electrically connected to the conditioning circuit.

6. The oscillator according to claim 5, wherein a temperature sensor is mounted on the second surface, adjacent the cavity and thermally communicated with the cavity through the substrate for monitoring the resonator temperature, the temperature sensor electrically connected to the conditioning circuit, the conditioning circuit operable to control the heater in response to the temperature sensor.

7. The oscillator according to claim 6, wherein the substrate is aluminum nitride.

8. The oscillator according to claim 7, wherein the resonator is electrically connected to the via by a conductive epoxy.

* * * * *